(12) United States Patent
Arakawa et al.

(10) Patent No.: US 6,724,206 B2
(45) Date of Patent: Apr. 20, 2004

(54) DEVICE CARRIER AND AUTOHANDLER

(75) Inventors: Osamu Arakawa, Tokyo (JP); Akio Nakamura, Nagano-ken (JP)

(73) Assignee: Ando Electric Co., Ltd., Tokyo (JP)

( * ) Notice: Subject to any disclaimer, the term of this patent is extended or adjusted under 35 U.S.C. 154(b) by 29 days.

(21) Appl. No.: 10/171,303

(22) Filed: Jun. 12, 2002

(65) Prior Publication Data

US 2002/0196040 A1 Dec. 26, 2002

(30) Foreign Application Priority Data

Jun. 22, 2001 (JP) ........................................ 2001-189661

(51) Int. Cl.⁷ ............................................. G01R 31/02
(52) U.S. Cl. ..................................... 324/755; 324/158.1
(58) Field of Search ................................ 324/754, 755, 324/765, 158.1; 298/33, 38

(56) References Cited

U.S. PATENT DOCUMENTS

| | | | | |
|---|---|---|---|---|
| 382,787 A | * | 5/1888 | Woolfolk | ...................... 298/33 |
| 2,723,878 A | * | 11/1955 | Rockwell | ...................... 298/36 |

FOREIGN PATENT DOCUMENTS

JP    2001-047122    2/2001

* cited by examiner

*Primary Examiner*—Ernest Karlsen
(74) *Attorney, Agent, or Firm*—Flynn, Thiel, Boutell & Tanis, P.C.

(57) ABSTRACT

A device carrier capable of reliably measuring electric characteristics of the device with accuracy and an autohandle are provided. The device carrier holds an IC having terminals on a lower face thereof at multiple positions, and allows the terminals to be brought into contact with contacts provided on an IC socket, wherein the device carrier comprises an opening through which the device can pass, a support part disposed on the opening for supporting the lower face of the IC, and a hinge part for turnably supporting the support part, wherein said supporter part is turned to release the support of the device when the socket approaches thereto. The supporter part engages with the release pins as the device carrier approaches to the IC socket to be turned so as to release the support of the lower face of the IC. The IC which has been released from being supported by the supporter part passes through the opening and is placed on the IC socket.

20 Claims, 4 Drawing Sheets

DEVICE CARRIER AND AUTOHANDLER

FIELD OF THE INVENTION

The invention relates to a device carrier for allowing terminals provided on a device such as an IC to be brought into contact with contacts of a socket.

BACKGROUND OF THE INVENTION

When measuring electric characteristics of an IC such as a ball grid array (BGA) type package IC, the IC is held by a device carrier and placed on an IC socket so that terminals formed of solder balls provided on the IC are allowed to be brought into contact with contacts provided on the IC socket.

Figure 6:
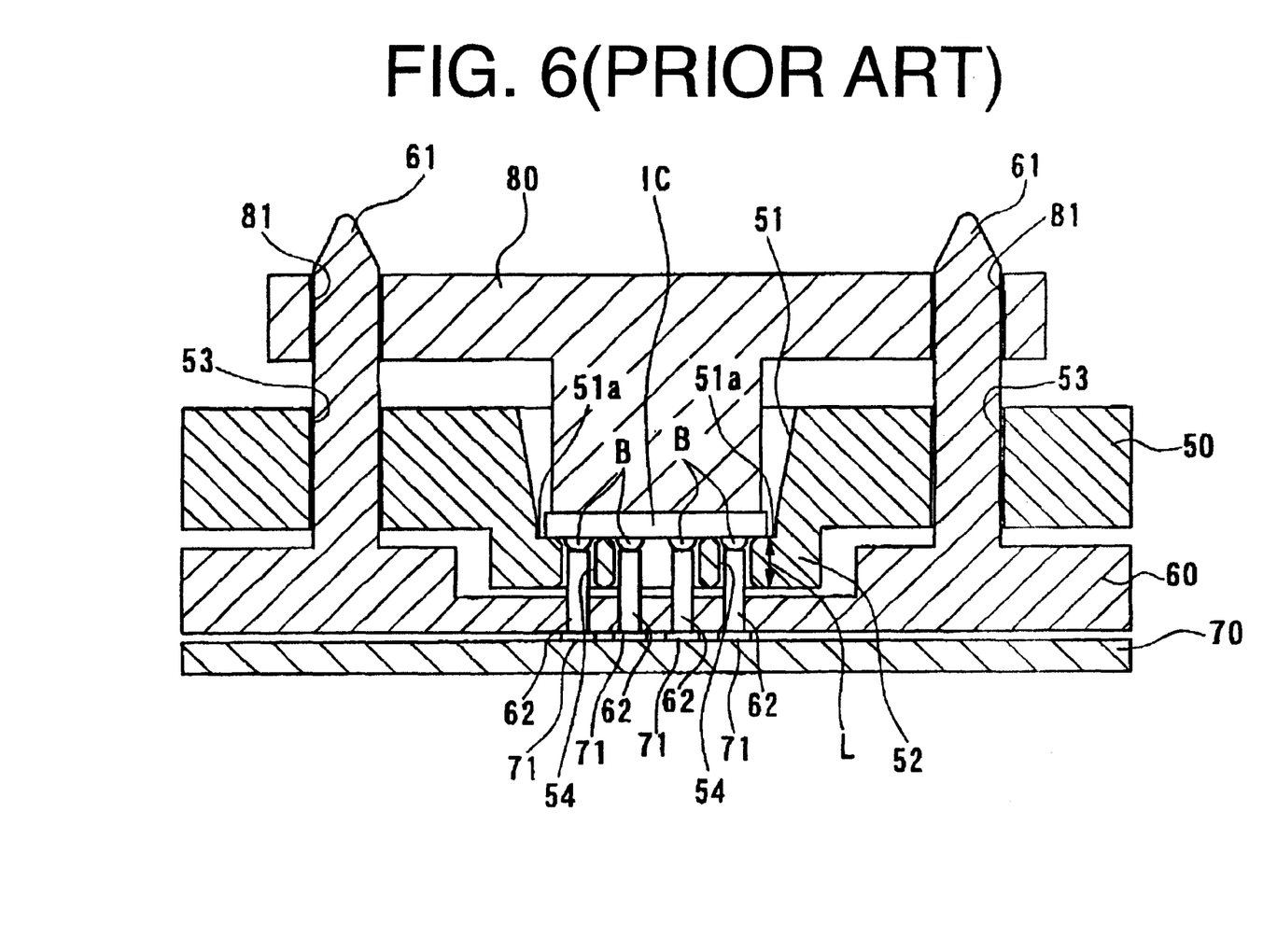
FIG. 6 is a sectional view of a conventional device carrier as viewed from the side thereof.

FIG. 6 is a side partial view of a conventional device carrier for holding an IC (device). In FIG. 6, a device carrier 50 has a recess 51 formed in a rectangular shape in cross section and guide holes 53 wherein an IC (BGA type package IC) is placed on the recess 51. Guide pins 61 formed on an IC socket 60 are inserted into the holes 53 of the IC device carrier 50. That is, the device carrier 50 and the IC socket 60 IC are positioned with respect to each other by the guide pins 61. Multiple ball-like terminals (solder balls) B are provided on the lower face of the IC. A positioning plate part 52 is provided on the bottom of the recess 51 of the device carrier 50 for positioning the IC disposed on the recess 51 with respect to the device carrier 50. Multiple positioning holes 54 are formed on the positioning plate part 52, wherein when the terminals B are fitted in the positioning holes 54, the IC is positioned with respect to the device carrier 50. Contacts 62 of the IC socket 60 are inserted into the positioning holes 54 of the device carrier 50 from the lower side thereof. A socket board 70 is disposed under the IC socket 60 and the lower ends of the contacts 62 contact seat patterns 71 of the socket board 70.

When measuring electric characteristics of the IC, the IC is first conveyed on the IC socket 60 by the device carrier 50 so that the IC socket 60 and the device carrier 50 are positioned with respect to each other. Upon completion of the positioning between the device carrier 50 and IC socket 60, the contacts 62 provided on the IC socket 60 are allowed to be brought into contact with the terminals B of the IC held by the device carrier 50. In a state where the contacts 62 provided on the IC socket 60 and the terminals B of the IC held by the device carrier 50 contact one another, the electric characteristics of the IC is measured. At this time, the IC placed on the device carrier 50 which is disposed over the IC socket 60 is pressed by a contact pusher 80 having guide holes 81 through which the guide pins 61 of the IC socket 60 are inserted, thereby assuring the contact between the terminals B and the contacts 62. The positioning plate part 52 on which the IC is placed is formed of nonconductive synthetic resin so that the terminals B of the IC and the contacts 62 of the IC socket 60 are not short-circuited when they contact each other.

When measuring the electric characteristics of the IC using the IC socket 60 shown in FIG. 6, particularly measuring the electric characteristics in high frequency region, it is preferable that a distance between the terminals B of the IC and the seat patterns 71 of the socket board 70 is set to be as short as possible. That is, if the length of each contact 62 is set to be as short as possible, the electric characteristics of the IC can be measured stably with high accuracy.

Meanwhile, when the length of each contact 62 is set to be short, a thickness L of the positioning plate part 52 has to be set to be thin. However, since the positioning plate part 52 is made of synthetic resin as set forth above, if the thickness L of the positioning plate part 52 is set to be thin, the strength of the positioning plate part 52 is significantly lowered. If the contact pusher 80 presses the IC in a state where the thickness L of the positioning plate part 52 made of synthetic resin is set to be thin, a stress is localized, e.g., on steps 51a and the like inside the recess 51, so that the steps 51a are bent, causing a problem that the device carrier 50 can not stably hold the IC. Further, there occurs a case where the ends of the IC supported by the steps 51a are bent, so that the electric characteristics of the IC is not stably measured with high accuracy.

SUMMARY OF THE INVENTION

The invention has been developed in view of the circumstances as set forth above and it is an object of the invention to provide a device carrier capable of stably measuring properties of the device with high accuracy and an autohandler.

achieve the above object, the device carrier for holding a device having terminals on a given face thereof at multiple positions, and allowing the terminals of the device to be brought into contact with contacts provided on an IC socket according to the first aspect of the invention is characterized in that the device carrier comprises an opening through which the device can pass, a support part disposed so as to close at least to a part of the opening for supporting the given face, and a hinge part for turnably supporting the support part, wherein said support part is turned to release the support of the given face of the device when it approaches to the socket.

According to the invention, the device carrier can hold the device stably by the support part which is disposed so as to close at least at a part of the opening through which the device can pass. Since the support part is turnably supported by the hinge part and is turned when it approaches to the socket, the opening is completely released when the support part is turned so that the device is moved toward the socket through the opening and it is directly placed on the socket. Since the device is directly placed on the socket when the support part is turned, so that the length of each contact of the socket can be set to be short. Accordingly, the properties of the device can be measured stably with high accuracy.

The device carrier according to the second aspect of the invention is characterized in that the hinge part according to the first aspect of the invention supports the device while biasing it in a direction to close the opening, and said support part is turned in a direction to open the opening while engaged with an engagement part provided on the socket.

According to the invention, the support part and the engagement part can be engaged with each other by merely approaching the device carrier and the socket to each other. As set forth above, the support of the device by the support part can be released by merely allowing the device carrier and the socket to approach to each other, so that the properties of the device can be easily and efficiently measured. Further, since the hinge part supports the support part while biasing the support part in the direction to close the opening, the support can stably support the given face of the device unless the support part of the device carrier and the engagement part of the socket are not engaged with each other.

The device carrier according to the third aspect of the invention is characterized in that the support part according to either first or second aspect of the invention comprises multiple support members for supporting multiple spots of the device at the given face thereof other than the spots where the terminals are provided.

According to the invention, since the support part comprises multiple support members and the multiple support members support given faces of the device, even if the size of one support member is small, the support members can stably support the device. Further, when the device is supported by the multiple support members, the size of each support member can be reduced. Accordingly, the turning space of each support member can be reduced, thereby making the device compact as a whole.

The device carrier according to the fourth aspect of the invention is characterized in that the device according to any of the first to third aspects of the invention further comprises a guide part provided on the device carrier at a portion in the vicinity of the opening for positioning the device while bringing into contact with the end face of the device.

According to the invention, since the guide part for positioning the device is provided in the vicinity of the opening, the terminals of the device which is moved from the device carrier to the socket and placed on the socket can be stabled made contact with the contacts of the socket with excellent accuracy.

The device carrier according to the fifth aspect of the invention is characterized in that the device according to any of the first to fourth aspects of the invention is a BGA type package IC having ball-like terminals.

According to the invention, even in the case of the device comprising a BGA type package IC having ball-like terminals, the contacts can be reliably positioned with respect to and brought into contact with the ball-like terminals.

An auto-handler provided according to the sixth aspect of the invention is characterized in having multiple device carriers according to any of claims 1 to 5.

According to the invention, since there are provided multiple device carriers enabling the terminals of the device and the contacts of the socket to be brought into contact with one another even if the length of each contact of the socket is short, it is possible to stably measure the electric characteristics of the device in the high frequency region without causing loose contact while multiple devices are brought into contact with the socket.

PREFERRED EMBODIMENT OF THE INVENTION

Figure 1:
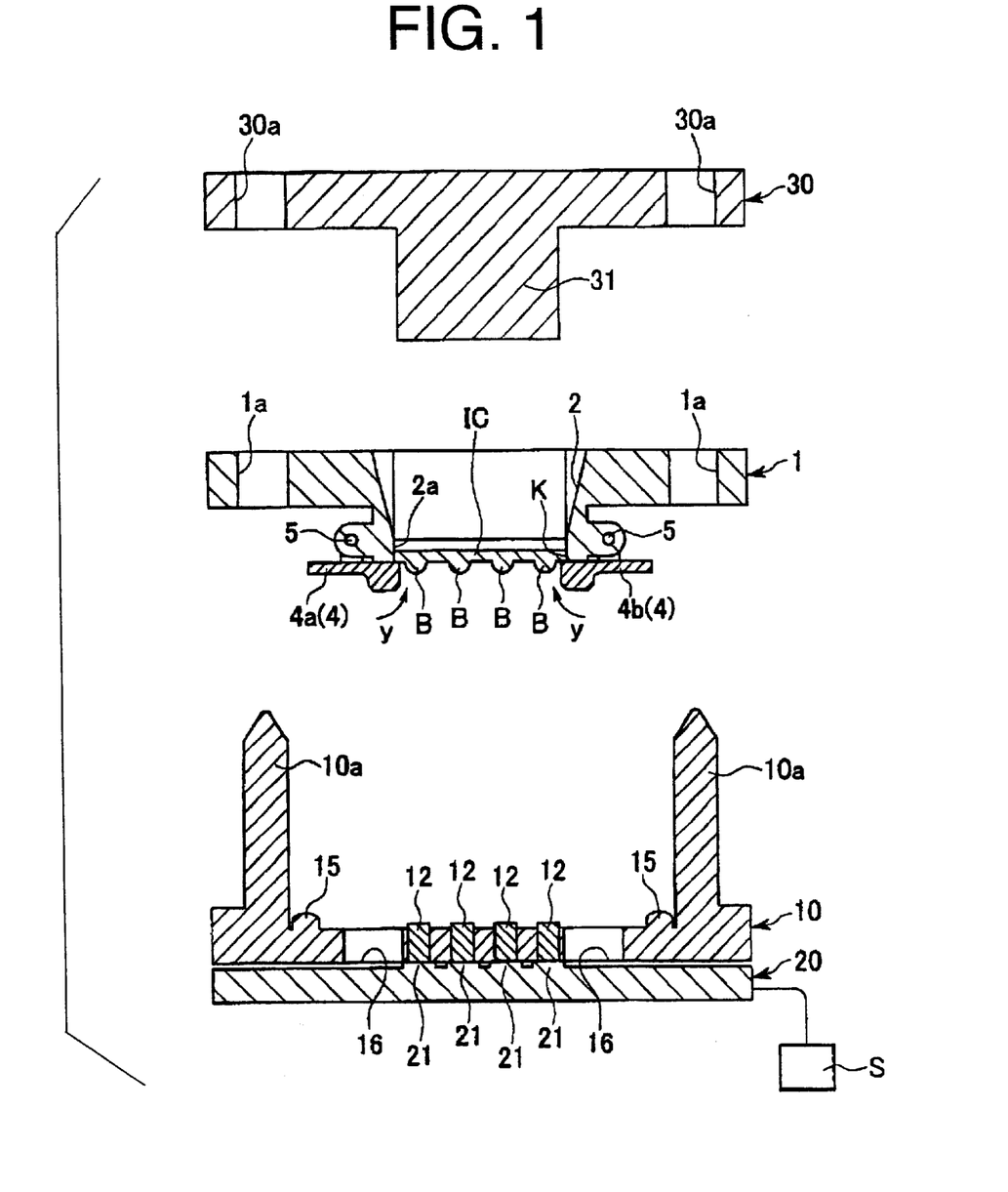
FIG. 1 is a sectional view of the construction of a device carrier as viewed from the side thereof according to the preferred embodiment of the invention.
Figure 2:
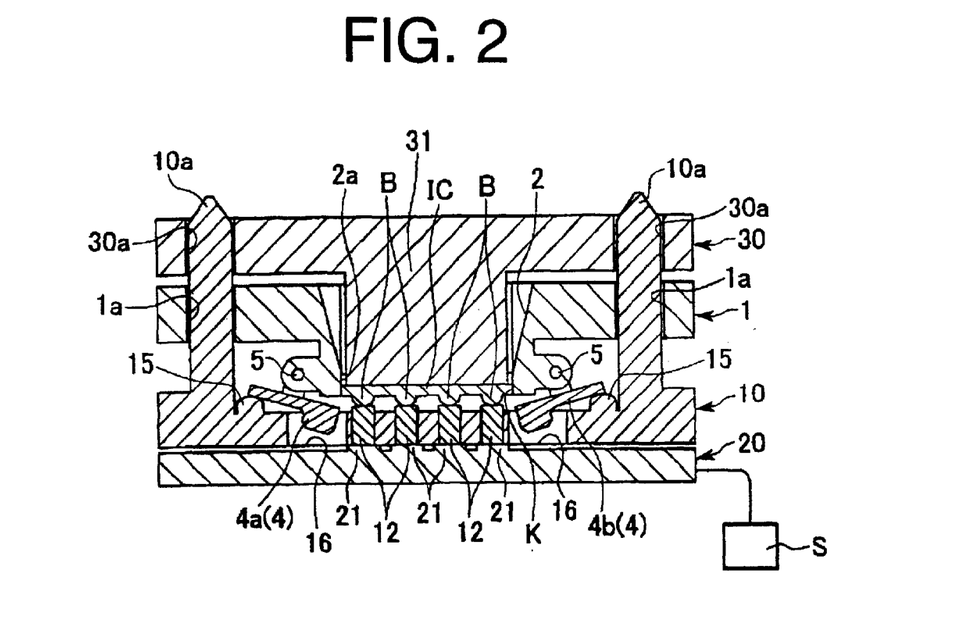
FIG. 2 is a sectional view of the construction of the device carrier as viewed from the side thereof according to the preferred embodiment of the invention, wherein the device carrier is placed on the socket.
Figure 3:
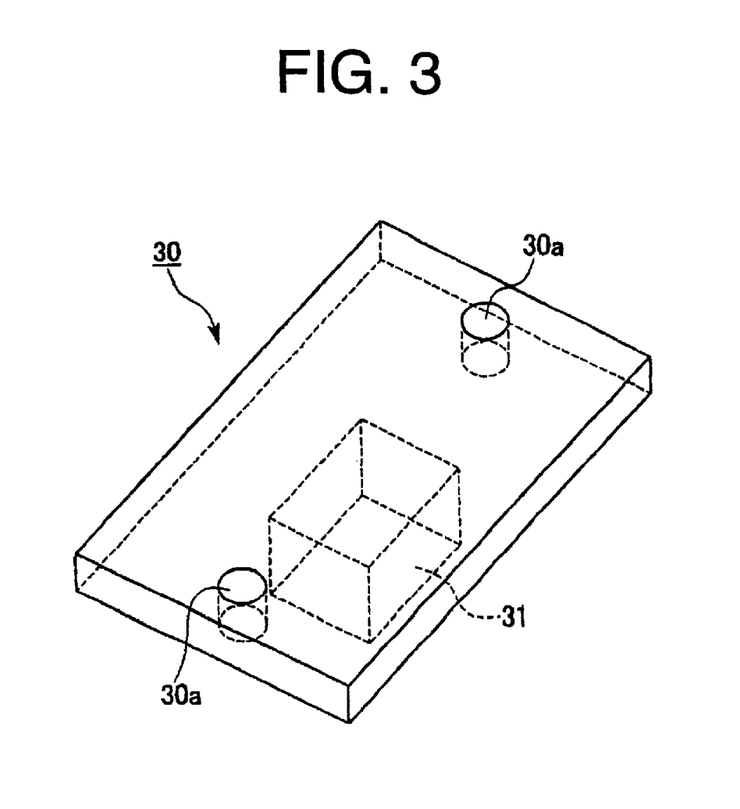
FIG. 3 is a perspective view of a contact pusher.
Figure 4:
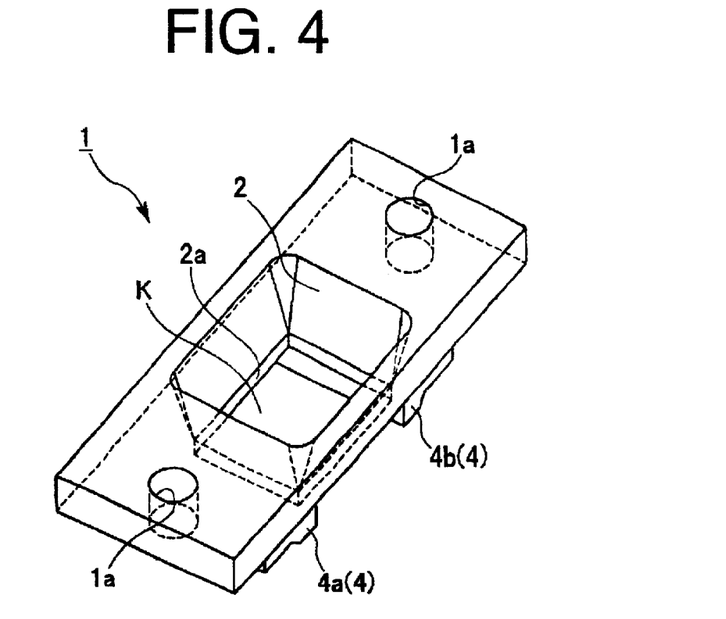
FIG. 4 is a perspective view of the device carrier.
Figure 5:
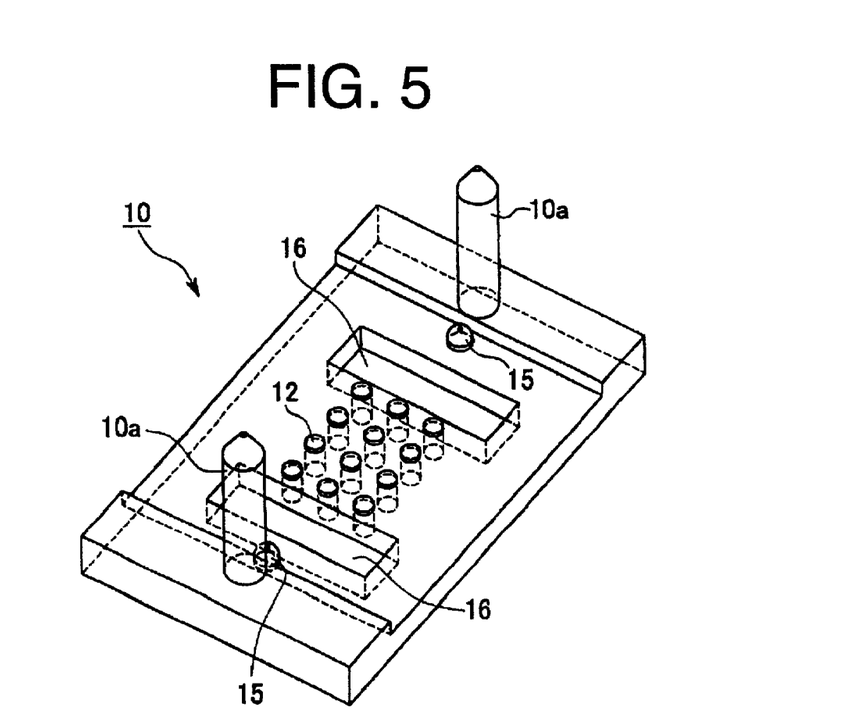
FIG. 5 is a perspective view of the socket.

A device carrier and an auto-handler according to a preferred embodiment of the invention are now described with reference to the attached drawings. FIG. 1 is a sectional view of the construction of a device carrier as viewed from the side thereof according to the preferred embodiment of the invention, FIG. 2 is a view showing a state where the device carrier is placed on a socket. FIG. 3 is a perspective view of a contact pusher, FIG. 4 is a perspective view of the device carrier, and FIG. 5 is a perspective view of the socket.

As shown in FIG. 1 and FIG. 2, the device carrier 1 has a recess part 2 which is rectangular in cross section and guide holes 1a. A BGA (Ball Grid array) type package IC (device) can be disposed inside the recess part 2. Ball-like terminals (solder balls) B are provided on the lower face of the IC (given face) at multiple positions.

An IC socket (socket) 10 having multiple contacts 12 is disposed under the device carrier 1. As shown in FIG. 5, guide pins 10a are provided in the IC socket 10. The guide pins 10a can be inserted into the guide holes 1a of the device carrier 1. When the guide pins 10a are inserted into the guide holes 1a of the device carrier 1, the device carrier 1 is positioned with respect to the IC socket 10.

A socket board 20 is disposed under the IC socket 10. The lower ends of the contacts 12 are brought into contact with seat patterns 21 of the socket board 20. The socket board 20 is connected to an IC tester (measuring device) S.

As shown in FIGS. 1, 2, and 4, the recess part 2 is set in the manner that an area part thereof in the horizontal direction becomes smaller in the descending order, namely, in the direction from the upper portion toward the bottom portion thereof. That is, the inner wall of the recess part 2 is tapered in cross section, so that it becomes smaller in the direction from the upper portion toward the bottom portion. At this time, a sectional area of the recess part 2 in the horizontal direction is formed larger than the IC, thereby facilitating the inserting operation and positioning of the IC with respect to the recess part 2.

There is formed an opening K at the bottom of the recess part 2 of the device carrier 1 through which an IC (device) can pass. The opening K is a through hole formed in the bottom of the device carrier 1 and has a size such that the IC can pass therethrough so that the outer configuration of the IC is limited thereby.

There is formed a supporter part 4 for supporting the lower face of the IC in the opening K. The supporter part 4 is disposed on both winds of the bottom of the device carrier 1 and comprises two opposite support members 4a, 4b as shown in FIGS. 1 and 2. Each of the support members 4a, 4b is disposed to close (clog) a part of the opening K and is supported to be turned about hinge parts 5 at both wing faces of the device carrier 1. The hinge parts 5 turnably support middle portions of the support members 4a, 4b. Meanwhile, as shown in FIG. 1, each of the two support members 4a, 4b, which are supported at the middle portions by the hinge parts 5, is disposed to close at least a part of the opening K at one end (its inner end), and supports the lower face of the IC except a portion where the terminals B are provided at its inner end. That is, the IC is supported by the support members 4a, 4b at the lower ends of the lower face thereof. Meanwhile, the other ends (outer ends) of the support members 4a, 4b form free ends which extend outward with respect to the device carrier 1.

A spring member (biasing member) such as a helical torsion spring, not shown, is attached to the hinge parts 5 for turnably supporting the support members 4a, 4b (supporter part 4), and it supports the inner ends of the support members 4a, 4b so as to bias the inner ends thereof upward in FIG. 1 (see the arrow y in FIG. 1). That is, the hinge parts 5 support the support members 4a, 4b while biasing them in the direction to close the opening K of the device carrier 1.

The biasing force of the hinge parts 5 is set to be equal to a force capable of supporting the IC at the inner ends of the support members 4a, 4b. That is, the biasing force of the hinge parts 5 is set to an extent not to move the inner ends of the support members 4a, 4b downward by the weight of the IC (to an extent where the opening K is not opened).

A cross sectional shape of the bottom of the recess part 2 in the horizontal direction is set to be equal to the IC as viewed from a plane thereof. As shown in FIG. 1, the IC is disposed on the bottom of the recess part 2 while it is supported by the supporter part 4. When the IC is disposed on the bottom of the recess part 2, the outer configuration of the IC is restricted by the inner wall of the recess part 2 at its bottom, so that the IC is positioned with respect to the device carrier 1. That is, the inner wall of the recess part 2 at its bottom restricts the outer configuration of the IC to form a guide part 2a for positioning the IC with respect to the device carrier 1.

The IC socket 10 has release pins (engagement part) 15, which engage with the outer ends of the support members 4a, 4b so as to push them upward, on the upper face thereof at the positions opposite to the outer ends of the support members 4a, 4b which approach thereto when the device carrier 1 and the IC socket 10 are positioned with respect to each other using the guide holes 1a and the guide pins 10a. The release pins 15 are protrusions protruded from the upper face of the IC socket 10, and two release pins 15 are provided so as to face the corresponding outer ends of the support members 4a, 4b.

The IC of the device carrier 1 disposed on the IC socket 10 is pressed by a contact pusher 30 having guide holes 30a into which the guide pins 10a of the IC socket 10 can be inserted. As shown in FIG. 3, the contact pusher 30 has a convex portion 31 to be inserted into the recess part 2 of the device carrier 1. When the guide pins 10a are inserted into the guide holes 30a, the contact pusher 30 effects pressing operation while positioned with respect to the device carrier 1 and the IC socket 10.

When the device carrier 1 holding the IC is disposed on the IC socket 10, the device carrier 1 is held by a moving mechanism, not shown, and is conveyed horizontally. Both the device carrier 1 and the moving mechanism are constituents of an auto-handler.

Described next is a method of measuring electric characteristics of the IC when the terminals B of the IC are brought into contact with contacts 12 by the device carrier 1. First of all, the IC is inserted into the recess part 2 of the device carrier 1 outside a temperature controlled bath. In this case, since the upper portion of the recess part 2 is formed larger than the IC, the IC can be easily inserted into the recess part 2. When the IC is moved to the bottom of the recess part 2 upon insertion into the recess part 2, it is positioned by the guide part 2a with respect to the device carrier 1, and is supported by the inner ends of the support members 4a, 4b which are arranged to clog up or close the opening K of the recess part 2. At this time, the IC is positioned such that the terminals B thereof are not brought into contact with the support members 4a, 4b and it is supported by the support members 4a, 4b at the lower face other than the portion where the terminals B are provided. Since the hinge parts 5 support the support members 4a, 4b with a biasing force not to release the opening K by the weight of the IC, the lower face of the IC is stably supported by the inner ends of the support members 4a, 4b.

When the IC is held by the device carrier 1, the device carrier 1 is conveyed onto the IC socket 10 provided inside the temperature controlled bath. The contact pusher 30 is disposed over the device carrier 1 (see FIG. 1).

The device carrier 1 conveyed over the IC socket 10 is lowered toward the IC socket 10. The device carrier 1 is lowered toward the IC socket 10 while the guide holes 1a thereof are inserted by the guide pins 10a of the IC socket 10. Upon insertion of the guide pins 10a of the IC socket 10 into the guide holes 1a of the device carrier 1, the device carrier 1 is positioned with respect to the IC socket 10.

The support members 4a, 4b provided on the device carrier 1 which lowers while being positioned with respect to the IC socket 10 are pushed upward at their outer ends by the release pins 15 as the device carrier 1 lowers. Then, respective support members 4a, 4b which are turnably supported by the hinge parts 5 are turned such that the inner ends thereof are moved downward by the release pins 15 as shown in FIG. 2. The inner ends of the support members 4a, 4b are evacuated or moved away from the opening K, and they are disposed accommodation recesses 16 provided on the IC socket 10. The turning of the support members 4a, 4b is not prevented by the accommodation recesses 16. In such a manner, the support members 4a, 4b are turned to release the opening K when they are pressed by the release pins 15 at their outer ends.

As the device carrier 1 approaches to the IC socket 10, the support members 4a, 4b are turned to release the opening K, thereby releasing the support of the IC. Since the opening K has a size capable of allowing the IC to pass therethrough, the IC passes through the released opening K and moved to the contacts 12 of the IC socket 10 disposed thereunder while guided by the guide part 2a. The IC moved downward while guided by the guide part 2a is brought into contact with the contacts 12 of the IC socket 10 at the terminals B thereof in a state where the end face of the IC is held by the guide part 2a and positioned with respect to the IC socket 10.

A distance between the lower face of the device carrier 1 and the upper face of the IC socket 10, when the device carrier 1 is brought into contact with the IC socket 10, is set to be lower than the height of the IC including the terminals B thereof. That is, the IC, which is placed on the IC socket 10 so as to drop on the IC socket 10 when the opening K is released, is always guided by the guide part 2a at its end face.

Thereafter, the IC held by the device carrier 1 is pushed downward by the contact pusher 30. When the IC disposed on the IC socket 10 is pushed downward from the above by the contact pusher 30, the terminals B thereof are brought into contact with the contacts 12 at an appropriate pressure. When the contacts 12 provided on the IC socket 10 and the terminals B of the IC held by the device carrier 1 contact each other, they are turned on so that the electric characteristics of the IC is measured by a testing signal of an IC S.

At this time, since the IC is directly placed on the IC socket 10 while the terminals B thereof are brought into contact with the contacts 12 of the IC socket 10, the length of each contact 12 of the IC socket 10 can be shortened and the electric characteristics of the IC can be measured in its high frequency region by the contact between the terminals B of the IC and the contacts 12 of the IC socket 10.

Upon completion of the measurement of the electric characteristics of the IC, the contact pusher 30 is moved upward and the device carrier 1 is also moved upward away from the IC socket 10. At this time, the support members 4a, 4b are supported by the hinge parts 5 while they are biased by the hinge parts 5 in the direction to close the opening K. Accordingly, as the device carrier 1 is moved upward, the outer ends of the support members 4a, 4b and the release pins 15 of the IC socket 10 are moved away from each other, the support members 4a, 4b are turned so as to close the opening K. The support members 4a, 4b thus turned so as to close the opening K support the lower face of the IC. The device carrier which holds the IC by its support members 4a, 4b transfers the IC electric characteristics of which were measured to a next step.

As mentioned above, since the opening K which is the through hole through which the IC can pass is provided on the device carrier 1, and the support members 4a, 4b which are turnably supported by the hinge parts 5 are provided on the opening K so that the opening K can be opened or closed by the support members 4a, 4b, the IC conveyed by the device carrier 1 can be brought into contact with the IC socket 10 by merely opening the opening K. At this time, the terminals B of the IC are directly placed on the contacts 12 of the IC socket 10, the length of each contact 12 can be shortened. Accordingly, the electric characteristics of the IC can be measured up to those in a high frequency region.

The operation to release the opening K can be easily performed by merely allowing the release pins 15 provided on the IC socket 10 to be brought into contact with the outer ends of the support members 4a, 4b which are turnably supported by the hinge parts 5 to turn the support members 4a, 4b as the device carrier 1 approaches to the IC socket 10.

Since the support members 4a, 4b are turnably supported by the hinge parts 5 while biased in the direction to close the opening K, they can stably support the lower face of the IC unless the support members 4a, 4b are not engaged with the release pins 15 of the IC socket 10. Upon completion of the electric characteristics of the IC, the support members 4a, 4b can stably support the IC when they are turned while biased in the direction to close the opening K by merely lifting the device carrier 1 with respect to the IC socket 10.

As described in the preferred embodiment, since the support part 4 comprises two members, i.e., the support members 4a, 4b, the IC can be stably supported at multiple spots (two ends of the lower face) even if the entire lower end of the IC is not supported. When the lower face of the IC is supported at multiple positions (two spots), the size of each of the support members 4a, 4b can be reduced, so that the opening K can be opened with a small turning amount of the support members 4a, 4b, namely, the opening K can be opened by slightly turning the support members 4a, 4b. That is, since the supporter part 4 comprises multiple support members, it is not necessary to support the entire lower face of the IC and it is possible to release the support of the IC with a small turning space. Accordingly, the device can be made compact as a whole. Although the supporter part 4 for supporting the lower face of the IC comprises two support members 4a, 4b, it may comprise optional multiple support members.

Since the guide part 2a for positioning the IC is provided in the vicinity of the opening K of the recess part 2, the terminals B of the IC which drops from the opening K to the IC socket 10 can be stably brought into contact with the contacts 12 of the IC socket 10 with excellent accuracy. As a result, the electric characteristics of the IC can be stably measured.

According to the device carrier 1 of the invention, it is possible to allow the ball-like terminals B of the BGA type package IC to be brought into contact with the contacts 12.

When the device carrier 1 of the invention is applied to an auto-handler, even if the length of each contact 12 of the IC socket 10 is short during the measurement of the electric characteristics, the terminals B of the IC are allowed to reliably brought into contact with the contacts 12 of the IC socket 10, thereby assuring a stable measurement of the electric characteristics by attaching multiple ICs to the IC socket 10, without causing loose contact in a high frequency region.

Although the operation to release the opening K is effected when the release pins 15 are engaged with the support members 4a, 4b as the device carrier 1 approaches to the IC socket 10 according to the invention, it may by effected by providing an actuator which turnably drives the support members 4a, 4b wherein the actuator is driven to open the opening K as the device carrier 1 approaches to the IC socket 10. For a timing for starting the driving of the actuator, it may be point of time when a distance between the device carrier 1 and the IC socket 10 is not more than a given value upon measurement of the distance by a measuring unit (e.g., optical sensor) capable of measuring the distance.

According to the first aspect of the invention, when the device carrier is merely approached to the socket, the supporter part for supporting the device, while closing the opening K, is turned, thereby releasing the opening so that the device can be directly placed on the socket. Accordingly, the length of each contact of the socket can be shortened, so that the electric characteristics of the device can be stabled measured with accuracy.

According to the second aspect of the invention, since the hinge parts support the supporter part while biasing the supporter part in the direction to close the opening, the support part can stably support the given face of the device unless the supporter part of the device carrier is not engaged with the engagement part of the socket. Further, the support of the device by the supporter part can be released by merely approaching the device carrier to the socket, so that the measurement of electric characteristics of the IC can be easily and efficiently effected.

According to the third aspect of the invention, since the supporter part 4 comprises multiple support members which support the given face of the device, it can support the device even if the size of each support member is small. Further, when the device is supported by the multiple support members while the size of each support member is made small, the turning space of each support member at the time when each support member is turned can be made small. Accordingly, the device can be made compact as a whole.

According to the fourth aspect of the invention, since the guide part is provided on the recess part, the terminals of the IC and the contacts of the socket can be stably brought into contact with each other with accuracy. Accordingly, the electric characteristics of the device can be stably measured.

According to the fifth aspect of the invention, since the device is formed of the BGA type package IC having ball-like terminals, the contacts of the IC socket can be positioned with respect to the ball-like terminals of the BGA type package IC, so that the contacts can be reliably brought into contact with the ball-like terminals.

According to the sixth aspect of the invention, since there are provided multiple device carriers for allowing the terminals of the device to be reliably brought into contact with the contacts of the socket even if the length of each contact of the socket is short, the electric characteristics of the IC can be reliably measured by attaching the multiple devices to the socket without causing loose contact therebetween.

What is claimed is:

1. In an IC device carrier which is adapted to hold an IC device having terminals on a given face thereof at multiple positions, and allow the terminals of the IC device to be brought into contact with contacts provided on an IC socket, the improvement of said device carrier comprising:

an opening formed in said IC device carrier through which the IC device can pass;

a support part disposed so as to close at least a part of the opening and support the given face of said IC device; and a hinge part for turnably supporting the support part on said IC device carrier wherein said support part is adapted to be turned in an opening direction to release the support of the given face of the IC device when said support part approaches the IC socket and support said IC device when said support part moves away from the IC socket.

2. The device carrier according to claim 1, wherein the hinge part supports the IC device while biasing said support part in a closing direction to close the opening; and said support part is adapted to be turned in the opening direction to open the opening while engaged with an engagement part provided on the IC socket.

3. The device carrier according to claim 1, wherein the support part comprises multiple support members for supporting multiple spots of the IC device on the given face thereof other than at the positions where the terminals are provided.

4. The device carrier according to claim 1, further comprising a guide part provided on the device carrier at a portion in the vicinity of the opening for positioning the IC device within the opening while being contact with an end face of the IC device.

5. The device carrier according to claim 1, wherein the IC device is a BGA type package IC having ball-like terminals on the given face.

6. In an IC handling unit comprising an IC socket having socket contacts provided thereon, and a device carrier which receives and supports an IC device thereon, said IC device having IC terminals on a terminal face thereof at multiple positions wherein said device carrier and said IC socket are relatively movable toward and away from each other to allow the IC terminals to be brought into contact with said socket contacts in response to said relative movement of said device carrier and said IC socket toward each other, comprising the improvement wherein said device carrier comprises an opening formed therein in which said IC device is receivable, a support part disposed proximate said opening to at least partially close said opening such that said support part supports said device carrier within said opening and prevents passage of said IC device therethrough, and a hinge arrangement which turnably supports said support part on said device carrier to permit said support part to be pivotable from a first position wherein said opening is at least partially closed and a second position wherein said opening is opened to permit movement of said IC device toward said IC socket, said support part being turned in response to relative movement of said device carrier and said IC socket toward each other to release said IC device and permit movement of said IC device;toward said socket contacts and permit contact of said IC terminals with said socket contacts.

7. The IC handling unit according to claim 6, wherein said support part is adapted to return to said first position during relative movement of said device carrier and said IC socket away from each other such that said IC device is removed from said IC socket by said device carrier.

8. The IC handling unit according to claim 7, wherein said hinge arrangement biases said support part to said first position while permitting movement of said support part to said second position.

9. The IC handling unit according to claim 8, wherein said support part comprises multiple support members which are hingedly connected by said hinge arrangement to said device carrier proximate said opening.

10. The IC handling unit according to claim 6, wherein said support part comprises multiple support members supported on said device carrier proximate said opening by said hinge arrangement, said support members having free ends which support the terminal face of said IC device at locations other than said positions of said IC terminals.

11. The IC handling unit according to claim 6, wherein said support part comprises multiple support members hingedly connected to said device carrier proximate said opening by said hinge arrangement, said IC socket including engagement parts which engage said support members to pivot said support members to said second position in response to movement of said device carrier and said IC socket toward each other.

12. The IC handling unit according to claim 11, wherein said support members include free ends which pivot downwardly, said IC socket including recesses defined therein into which said free ends of said support members move when said support members are in said second position.

13. In an IC handling unit comprising an IC socket having socket contacts provided thereon, and a device carrier which receives and supports an IC device thereon, said IC device having IC terminals on a terminal face thereof at multiple positions wherein said device carrier and said IC socket are relatively movable toward and away from each other to allow the IC terminals to be brought into contact with said socket contacts in response to said relative movement of said device carrier and said IC socket toward each other, comprising the improvement wherein said carrier device comprises an opening into which said IC device is received, one or more support members hingedly connected to said carrier device proximate said opening by a hinge arrangement, said support members being movable between first and second positions, each of said support members including a support section projecting into said opening when said support member is in said first position to at least partially close said opening and support said IC device thereon, and further including engagement portions which are adapted to be contacted by said IC socket and moved to effect pivoting of said support members to said second position as said device carrier and said IC socket are moved toward each other, said support portions being disposed out of said opening when said support members are in said second position to permit downward displacement of said IC device such that said IC terminals contact said socket contacts.

14. The IC handling unit according to claim 13, wherein said IC socket includes upward facing engagement surfaces which contact said engagement portions of said support members and pivot said support portions downwardly out of said opening.

15. The IC handling unit according to claim 14, which further include a socket board disposed adjacent said IC socket and electrically contacting said IC contacts, said socket :board being connected to an IC tester for testing said IC device when said IC terminals are disposed in contact with said socket contacts.

16. The IC handling unit according to claim 13, wherein said support portions include upward facing support surfaces on which said IC device is supported.

17. The IC handling unit according to claim 15, wherein, said IC socket includes recesses disposed below said support portions into which said support portions are received downwardly during upward movement of said engagement portions.

18. The IC handling unit according to claim 13, wherein said support portions of said support members support an edge portion of said IC device disposed outwardly of said IC terminals.

19. The IC handling unit according to claim 17, wherein said IC device is a BGA-type package IC having ball-like terminals which project downwardly from said terminal face, said support portions of said support members being spaced apart to define a space in which said ball-like terminals are disposed.

20. The IC handling unit according to claim 13, wherein said support members are configured such that movement of said support members is effected solely by contact of said support members with said IC socket.

* * * * *